United States Patent
Shibata

(10) Patent No.: US 10,979,061 B2
(45) Date of Patent: Apr. 13, 2021

(54) ANALOG-DIGITAL CONVERSION DEVICE

(71) Applicant: DENSO CORPORATION, Kariya (JP)

(72) Inventor: Yusuke Shibata, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/817,982

(22) Filed: Mar. 13, 2020

(65) Prior Publication Data

US 2020/0220552 A1 Jul. 9, 2020

Related U.S. Application Data

(63) Continuation of application No. PCT/JP2018/034057, filed on Sep. 13, 2018.

(30) Foreign Application Priority Data

Sep. 20, 2017 (JP) .............................. JP2017-180510

(51) Int. Cl.
*H03M 1/10* (2006.01)

(52) U.S. Cl.
CPC ................................ *H03M 1/1071* (2013.01)

(58) Field of Classification Search
CPC ............ H03M 1/12; H03M 1/56; H03M 7/10; H03M 1/124; H03M 1/167; H03M 1/365; H03M 3/458; H03M 1/00; H03M 1/002; H03M 1/06; H03M 1/14; H03M 1/164; H03M 1/462; H03M 1/66; H03M 1/1014; H03M 1/1215; H03M 1/1245; H03M 1/004; H03M 1/1205

USPC .................................. 341/118–120, 155, 141
See application file for complete search history.

(56) References Cited

U.S. PATENT DOCUMENTS

| | | | | |
|---|---|---|---|---|
| 5,870,042 A | * | 2/1999 | Noda | ..................... H03M 1/109 341/118 |
| 6,750,800 B2 | * | 6/2004 | Yoshinaga | .......... H03M 1/1023 341/118 |
| 6,933,867 B2 | * | 8/2005 | Honda | .................... F02D 41/28 341/118 |

(Continued)

FOREIGN PATENT DOCUMENTS

| | | |
|---|---|---|
| JP | 2001-244813 A | 9/2001 |
| JP | 2007-300469 A | 5/2007 |

(Continued)

*Primary Examiner* — Linh V Nguyen
(74) *Attorney, Agent, or Firm* — Maschoff Brennan

(57) ABSTRACT

An analog-to-digital conversion device includes: a switch connected to input units through signal lines to receive external voltages selecting and outputting one external voltage; an S/H circuit holding a voltage corresponding to an output of the switch; a converter performing AD conversion based on the voltage; and a controller determining the external voltage selected by the switch and performing a disconnection determination whether a disconnection occurs in the signal line. In the disconnection determination, the controller controls the switch to select a reference voltage different from the external voltage before controlling the switch to select the external voltage to be determined, and performs the disconnection determination based on a voltage difference between the reference voltage and the external voltage after controlling the switch to select the external voltage.

8 Claims, 10 Drawing Sheets

(56) References Cited

U.S. PATENT DOCUMENTS

| | | | | |
|---|---|---|---|---|
| 7,310,575 B2* | 12/2007 | Honda | ............... | G01L 23/225 |
| | | | | 123/406.21 |
| 7,427,936 B2* | 9/2008 | Takeuchi | ............ | H03M 1/1076 |
| | | | | 341/118 |
| 8,324,861 B2* | 12/2012 | Huo | ................... | H01M 10/48 |
| | | | | 320/116 |
| 2004/0263366 A1* | 12/2004 | Yada | ................ | H03M 1/1023 |
| | | | | 341/118 |
| 2005/0160334 A1* | 7/2005 | Kabune | ............ | H03M 1/1076 |
| | | | | 714/724 |
| 2007/0179756 A1* | 8/2007 | Honda | ............... | G01L 23/225 |
| | | | | 702/190 |
| 2007/0252744 A1 | 11/2007 | Takeuchi | | |
| 2009/0289822 A1 | 11/2009 | Kabune et al. | | |
| 2010/0245141 A1* | 9/2010 | Ushie | ................ | H03M 1/1076 |
| | | | | 341/122 |
| 2015/0070023 A1* | 3/2015 | Kudo | ................ | H01M 10/482 |
| | | | | 324/426 |

FOREIGN PATENT DOCUMENTS

| | | |
|---|---|---|
| JP | 2009-284302 A | 12/2009 |
| JP | 2016-025594 A | 2/2016 |

\* cited by examiner

ANALOG-DIGITAL CONVERSION DEVICE

CROSS REFERENCE TO RELATED APPLICATION

The present application is a continuation application of International Patent Application No. PCT/JP2018/034057 filed on Sep. 13, 2018, which designated the U.S. and claims the benefit of priority from Japanese Patent Application No. 2017-180510 filed on Sep. 20, 2017. The entire disclosures of all of the above applications are incorporated herein by reference.

TECHNICAL FIELD

The present disclosure relates to an analog-to-digital (hereinafter simply referred to as AD) conversion device.

BACKGROUND

Conventionally, an AD conversion device has been proposed which performs AD conversion while sequentially selecting input signals, which are analog signals input from multiple input units. More specifically, the AD conversion device includes a multiplexer as a switching unit connected to the multiple input units through signal lines, and one input signal is selected from the multiple input signals input from the multiple input units by the multiplexer. The input signal selected by the multiplexer is AD-converted by a converter. In the AD conversion device, pull-down resistors for detecting disconnection are provided in the signal lines between the multiplexer and the respective input units.

The signal line between the multiplexer and each input unit is configured to have a signal line such as a wire connecting a terminal of a chip on which the multiplexer is mounted and a terminal of the input unit, and a signal line such as a wiring patter connecting the terminal of the chip and the multiplexer.

SUMMARY

According to an example, an analog-to-digital conversion device includes: a switch connected to input units through signal lines to receive external voltages selecting and outputting one external voltage; an S/H circuit holding a voltage corresponding to an output of the switch; a converter performing AD conversion based on the voltage; and a controller determining the external voltage selected by the switch and performing a disconnection determination whether a disconnection occurs in the signal line. In the disconnection determination, the controller controls the switch to select a reference voltage different from the external voltage before controlling the switch to select the external voltage to be determined, and performs the disconnection determination based on a voltage difference between the reference voltage and the external voltage after controlling the switch to select the external voltage.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
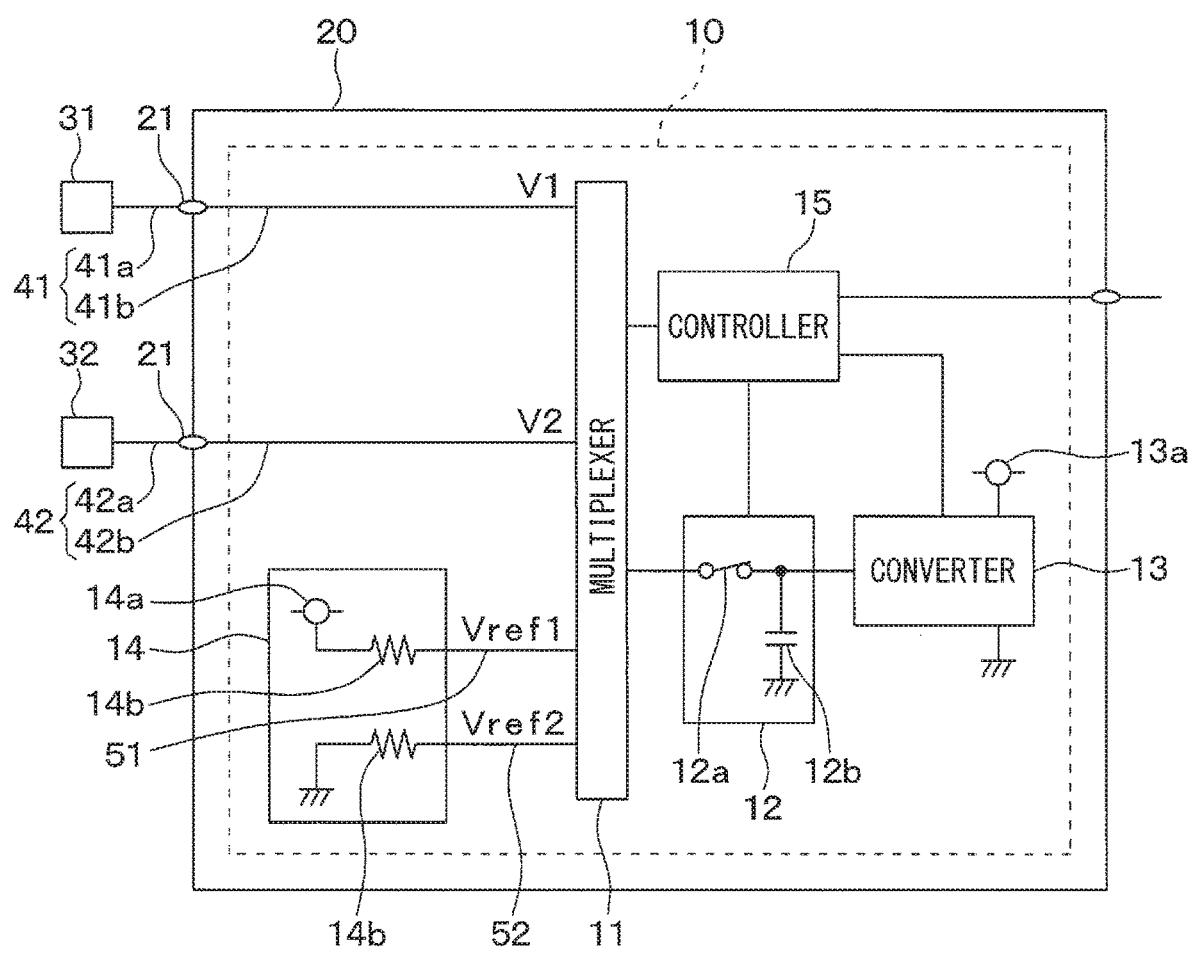
FIG. 1 is a diagram schematically showing an AD conversion device according to a first embodiment.

An analog-to-digital (hereinafter simply referred to as AD) conversion device is capable of performing a disconnection determination as to whether or not a disconnection has occurred in a signal line between a switching unit and an input unit.

However, in a conceivable AD conversion device, in order to detect the disconnection of the signal line connecting the multiplexer and each input unit, there is a need to provide a pull-down resistor to each signal line, which causes an increase in a circuit scale. In particular, when a large number of input units are connected to the multiplexer, the circuit scale is remarkably increased by providing the pull-down resistors to the respective signal lines.

An AD conversion device is provided to be capable of detecting whether or not a disconnection occurs in a signal line while reducing a circuit scale.

According to an example embodiment, an AD conversion device includes: a switching unit that is connected to a plurality of input units through signal lines, receives external voltages, which are analog signals, from the plurality of input units, selects one external voltage from the plurality of external voltages and outputs the selected external voltage; a sample and hold circuit that holds a voltage corresponding to the external voltage output from the switching unit; a converter that performs AD conversion based on the voltage held by the sample and hold circuit; and a controller that determines the external voltage selected by the switching unit and performs a disconnection determination as to whether or not a disconnection has occurred in the signal line. The AD conversion device includes a reference voltage input unit that is connected to the switching unit and inputs a predetermined reference voltage to the switching unit. In the disconnection determination, the controller causes the switching unit to select a reference voltage having a value different from that of the external voltage, before causing the switching unit to select the external voltage input through the signal line to be determined in the disconnection determination, and after causing the switching unit to select the external voltage, based on the presence or absence of a change in voltage between the reference voltage and the external voltage held in the sample and hold circuit, the controller determines that a disconnection has occurred in the signal line when the change in voltage falls within a predetermined range.

According to the above configuration, the disconnection determination is performed based on the presence or absence of the change in the voltage held by the sample and hold circuit. For that reason, there is no need to provide a pull-down resistor in each signal line, and a circuit scale can be reduced.

According to an example embodiment, the switching unit receives a first external voltage within a first predetermined range from a first input unit which is one of the plurality of input units, receives a second external voltage within a second predetermined range from a second input unit which is one of the plurality of input units, and receives a first reference voltage having a value different from the value within the first predetermined range and a second reference voltage having a value different from the second predetermined range and having the value different from the first reference voltage, from a reference voltage input unit. In the disconnection determination, the controller is configured to cause the switching unit to select the first reference voltage before causing the switching unit to select the first external voltage, and, after causing the switching unit to select the first external voltage, based on the presence or absence of a change in voltage between the first reference voltage and the first external voltage held in the sample and hold circuit, perform a first disconnection determination to determine that a disconnection has occurred in the signal line between the first input unit and the switching unit when the change in the voltage falls within a predetermined range, and the controller is configured to cause the switching unit selects the second reference voltage before causing the switching unit to select the second external voltage, and, after causing the switching unit to select the second external voltage, based on the presence or absence of a change in voltage between the second reference voltage and the second external voltage held in the sample and hold circuit, perform a second disconnection determination to determine that the disconnection has occurred in the signal line between the second input unit and the switching unit when the change in the voltage falls within the predetermined range.

According to the above configuration, in the first disconnection determination, the first reference voltage and the first external voltage having different values from each other are sequentially selected by the switching unit. For that reason, the controller can easily perform the first disconnection determination based on the presence or absence of a change in the voltage held by the sample and hold circuit. In the second disconnection determination, the second reference voltage and the second external voltage having different values from each other are sequentially selected by the switching unit. For that reason, the controller can easily perform the second disconnection determination based on the presence or absence of a change in the voltage held by the sample and hold circuit.

Incidentally, reference numerals with parentheses attached to the respective components and the like indicate an example of a correspondence relationship between the components and the like and specific components and the like described in the embodiment to be described later.

Embodiments of the present disclosure will be described below with reference to the drawings. In the following embodiments, the same reference numerals are assigned to parts that are the same or equivalent to each other to describe the same.

First Embodiment

A first embodiment will be described. As shown in FIG. 1, an AD conversion device 10 according to the present embodiment is mounted on an IC (that is, integrated circuit) chip 20, and is configured to AD-convert external voltages of analog signals input from external input units 31 and 32 into digital signals. In the present embodiment, in order to facilitate understanding, a case in which a first detection voltage V1 as the external voltage is input from the first input unit 31 and a second detection voltage V2 as the external voltage is input from the second input unit 32 to the IC chip 20 will be described. However, detection voltages as the external voltages may be input to the IC chip 20 from further multiple input units.

The AD conversion device 10 includes a multiplexer (that is, MPX) 11, a sample and hold (hereinafter simply referred to as S/H) circuit 12, a converter 13, a reference voltage input unit 14, and a controller 15.

The multiplexer 11 is connected to the first input unit 31 through a first signal line 41, and is connected to the second input unit 32 through a second signal line 42. In the present embodiment, the first signal line 41 has a signal line 41a such as a wire disposed between one connection terminal 21 of the IC chip 20 and a terminal of the first input unit 31, and a signal line 41b such as a wiring pattern formed in the connection terminal 21 and the IC chip 20. Similarly, the second signal line 42 has a signal line 42a such as a wire disposed between another connection terminal 21 of the IC chip 20 and a terminal of the second input unit 32, and a signal line 42b such as a wiring patter formed in the connection terminal 21 and the IC chip 20. In the present embodiment, the multiplexer 11 corresponds to a switching unit.

The multiplexer 11 selects one input signal from multiple input signals to be input, based on a control signal from the controller 15, and outputs the selected input signal to the S/H circuit 12. In the present embodiment, the multiplexer 11 receives the first detection voltage V1 from the first input unit 31 and the second detection voltage V2 from the second input unit 32 as the input signals. In addition, the multiplexer 11 receives a first reference voltage Vref1 and a second reference voltage Vref2 as the input signals from the reference voltage input unit 14 although will be described in detail later.

In the present embodiment, the first input unit 31 and the second input unit 32 are configured by various sensors such as a pressure sensor, a temperature sensor, an acceleration sensor, an angular velocity sensor, and the like, and each have a ground circuit connected to the ground inside, although not particularly shown. In the present embodiment, the ground circuit is configured to include a capacitor or the like disposed between the ground and the output terminals of the input units 31 and 32, and also functions as a filter circuit for reducing noise. In other words, according to the present embodiment, a general filter circuit is used as the ground circuit.

The S/H circuit 12 includes a switch 12a connected between the multiplexer 11 and the converter 13, and a capacitor 12b connected between a connection point of the switch 12a and the converter 13 and the ground. When the switch 12a is turned on, the S/H circuit 12 is connected to the multiplexer 11, and the capacitor 12b enters a charge state based on a voltage input from the multiplexer 11. In other words, the S/H circuit 12 holds the voltage input from the multiplexer 11 when the switch 12a is turned on.

The converter 13 includes a comparator and the like, and is configured to be able to quantize (that is, digitize) a voltage between a conversion reference voltage (for example, 5 V) and a ground voltage (for example, a predetermined voltage) applied from a reference power supply 13a. The converter 13 converts the voltage held in the S/H circuit 12 into a digital signal based on the control signal from the controller 15, and outputs the digital signal to the controller 15.

The reference voltage input unit 14 is configured to include a power supply 14a, a resistor 14b, and the like, and is connected to the multiplexer 11 through signal lines 51 and 52 such as wiring patterns, and inputs multiple reference voltages to the multiplexer 11. In the present embodiment, the reference voltage input unit 14 inputs, to the multiplexer 11, the first reference voltage Vref1 through the signal line 51 and also inputs the second reference voltage Vref2 through the signal line 52. In the present embodiment, the first reference voltage Vref1 is set to a value corresponding to the voltage of the power supply 14a, and the second reference voltage Vref2 is set to the ground voltage (that is, 0 V).

The controller 15 is a control circuit which is configured by, for example, a microcomputer, a storage unit such as a memory, and peripheral circuits of the microcomputer and the storage unit, and executes a predetermined process in accordance with a program stored in the storage unit or the like. The controller 15 is connected to the multiplexer 11, the S/H circuit 12, the converter 13, an external circuit, and the like.

The controller 15 inputs the control signal to the multiplexer 11, to thereby determine and change the input signal selected by the multiplexer 11. Further, the controller 15 switches the on-state and the off-state of the switch 12a by inputting a control signal to the S/H circuit 12. Further, the controller 15 inputs the control signal to the converter 13, to thereby cause the converter 13 to perform AD conversion, and cause the controller 15 to receive the converted digital signal. Upon receiving the digital signal from the converter 13, the controller 15 performs a predetermined process while storing the digital signal in the storage unit as necessary. In the present embodiment, as one of predetermined processes, the controller 15 performs a disconnection determination as to whether or not a disconnection has occurred in the first and second signal lines 41 and 42 between the multiplexer 11 and the respective input units 31 and 32.

Incidentally, although will be described in more detail later, when performing the disconnection determination, before the controller 15 causes the multiplexer 11 to select a detection voltage input through the signal line to be determined in the disconnection determination, the controller 15 causes the multiplexer 11 to select a reference voltage having a value different from that of the detection voltage. For example, in the present embodiment, a normal range of the first detection voltage V1 is set to 0 to 3 V, a normal range of the second detection voltage V2 is set to 2 to 5 V, the first reference voltage Vref1 is set to 5 V, and the second reference voltage Vref2 is set to 0 V. For that reason, when performing the disconnection determination of the first signal line 41, before the controller 15 causes the multiplexer 11 to select the first detection voltage V1, the controller 15 causes the multiplexer 11 to select the first reference voltage Vref1. In addition, when performing the disconnection determination of the second signal line 42, before the controller 15 causes the multiplexer 11 to select the second detection voltage V2, the controller 15 causes the multiplexer 11 to select the second reference voltage Vref2. Then, the controller 15 performs a first disconnection determination as to whether or not the first signal line 41 is disconnected (hereinafter simply referred to as the first disconnection determination), based on the digital signal corresponding to the first detection voltage V1 and the first reference value Vref1 corresponding to the first reference voltage Vref1. The controller 15 performs a second disconnection determination as to whether or not the second signal line 41 is disconnected (hereinafter simply referred to as the second disconnection determination), based on the digital signal corresponding to the second detection voltage V2 and the digital signal corresponding to the second reference voltage Vref2.

The normal range of the first detection voltage V1 is a range that can be taken by the first detection voltage V1, and corresponds to a first predetermined range. The normal range of the second detection voltage V2 is a range that can be taken by the second detection voltage V2, and corresponds to a second predetermined range.

Figure 2A:
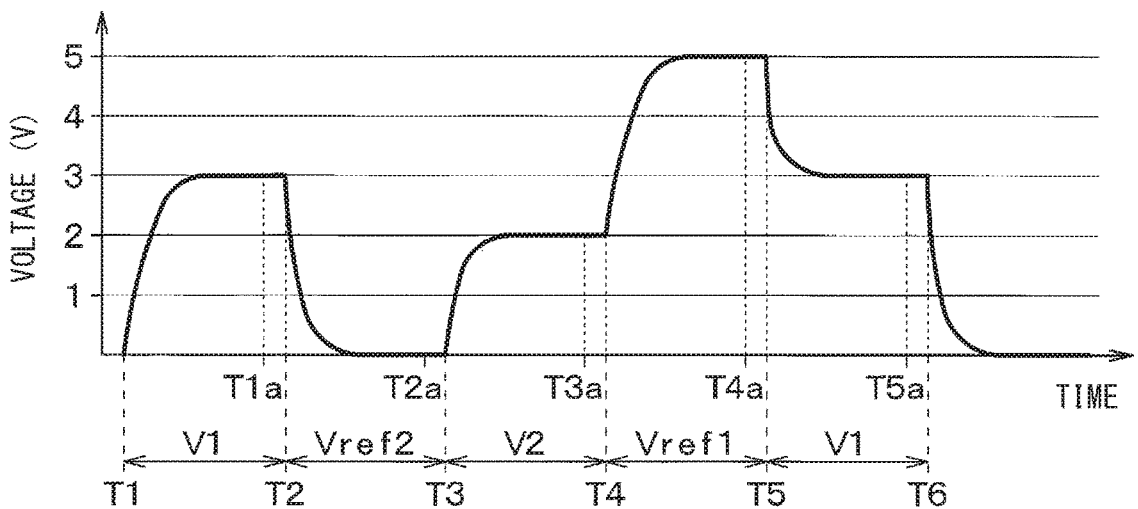
FIG. 2A is a timing chart showing a voltage of a capacitor in a normal state.
Figure 2B:
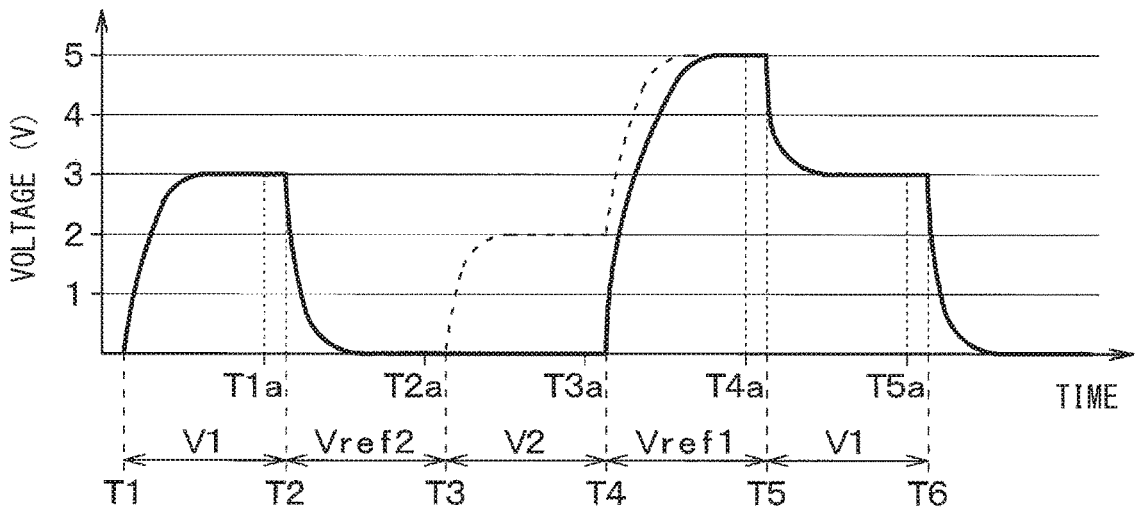
FIG. 2B is a timing chart showing the voltage of the capacitor when a disconnection occurs in a second signal line between a second input unit and a multiplexer.
Figure 2C:
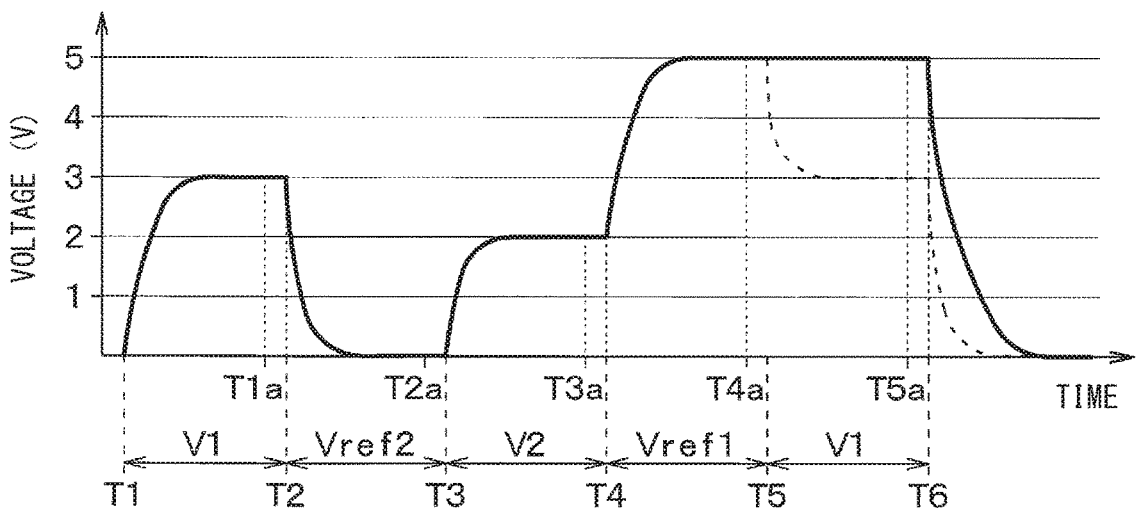
FIG. 2C is a timing chart showing a voltage of the capacitor when a disconnection occurs in a first signal line between a first input unit and the multiplexer.

The AD conversion device 10 according to the present embodiment is configured as described above. Next, operations performed by the controller 15 in the AD conversion device 10 will be described referring to FIGS. 2A to 2C showing a voltage of the capacitor 12b. In the present embodiment, it is assumed that the normal range of the first detection voltage V1 is 0 to 3 V, the normal range of the second detection voltage V2 is 2 to 5 V, the first reference voltage Vref1 is 5 V, and the second reference voltage Vref2 is 0 V. In the following description, an example will be described below in which the first detection voltage V1 when the first detection voltage V1 is selected by the multiplexer 11 is 3 V, and the second detection voltage V2 when the second detection voltage V2 is selected is 2 V. FIGS. 2A to 2C show voltages selected by the multiplexers 11 between the respective time points. The following processing may be performed, for example, continuously at all times, may be performed only when the IC chip 20 is activated, or may be performed every predetermined period.

Initially, as shown in the diagram 2A, at a time point T1, the controller 15 causes the multiplexer 11 to select the first detection voltage V1, and turns on the switch 12a. As a result, charges based on the first detection voltage V1 are accumulated in the capacitor 12b to obtain a voltage corresponding to the first detection voltage V1. Then, the controller 15 turns off the switch 12a at a time point T1a, causes the converter 13 to generate a digital signal based on the voltage of the capacitors 12b, and receives the digital signal. Thereafter, the controller 15 performs a predetermined process using the digital signal.

Next, at a time point T2, the controller 15 causes the multiplexer 11 to select the second reference voltage Vref2 and turns on the switch 12a. At this time, the first detection voltage V1 selected at the time point T1 is 3 V, and the second reference voltage Vref2 is 0 V. For that reason, the accumulated charges are discharged from the ground of the reference voltage input unit 14, and the capacitor 12b has a voltage corresponding to the second reference voltage Vref2. Then, the controller 15 turns off the switch 12a at a time point T2a, causes the converter 13 to generate a digital signal based on the voltage of the capacitor 12b, and receives the digital signal. Thereafter, the controller 15 performs a predetermined process using the digital signal.

Subsequently, at a time point T3, the controller 15 causes the multiplexer 11 to select the second detection voltage V2, and turns on the switch 12a. As a result, charges based on the second detection voltage V2 are accumulated in the capacitor 12b, and a voltage corresponding to the second detection voltage V2 is obtained. Then, the controller 15 turns off the switch 12a at a time point T3a, causes the converter 13 to generate a digital signal based on the voltage of the capacitor 12b, and receives the digital signal. Thereafter, the controller 15 performs a predetermined process using the digital signal. More specifically, at this time, the controller 15 executes a second disconnection determination as one of the predetermined processes.

In other words, when the second signal line 42 is not disconnected, the capacitor 12b has a voltage corresponding to the second detection voltage V2, as shown in FIG. 2A. On the other hand, when the second signal line 42 is disconnected, the voltage of the capacitor 12b does not change even if the second detection voltage V2 is selected by the multiplexer 11 as shown in FIG. 2B. In other words, the digital signal generated at the time point T2a and the digital signal generated at the time point T3a are the same signal. For that reason, when the digital signal generated at the time point T2a and the digital signal generated at the time point T3a are the same signal, the controller 15 determines that a disconnection has occurred in the second signal line 42, and outputs a control signal for notifying an external circuit or the like of the occurrence of the disconnection.

In the present embodiment, as described above, the normal range of the second detection voltage V2 is 2 to 5 V, and the second reference voltage Vref2 is 0 V. For that reason, when the second signal line 42 is not disconnected, a digital signal having a value different from that of the digital signal corresponding to the second detection voltage V2 is generated before the digital signal corresponding to the second detection voltage V2 is generated. Therefore, the controller 15 can easily perform the second disconnection determination by determining whether or not the digital signal generated at the time point T2a coincides with the digital signal generated at the time point T3a. In the present embodiment, the second disconnection determination is performed by determining whether the digital signals coincide with each other, but the determination may be based on a change in the voltage between the second reference voltage Vref2 and the second detection voltage V2 held by the capacitor 12b of the S/H circuit 12.

In this example, the same signal in the present specification means substantially the same signal including the effects of a conversion error, a leakage current, and the like. Similarly, two digital signals matching each other in the present specification means substantially matching including effects of the conversion error, the leakage current, and the like. In other words, when comparing the two digital signals with each other, the controller 15 determines that the two digital signals coincide with each other when the two digital signals completely coincide with each other and when a change in the two digital signals falls within a predetermined range. When executing the disconnection determination, the controller 15 determines that the disconnection has occurred when a difference between the two digital signals falls within a predetermined range. In other words, the second disconnection determination performed by the controller 15 can be regarded as a determination that a disconnection has occurred in the second signal line 42 when the change in the voltage of the second reference voltage Vref2 and the second detection voltage V2 held by the capacitors 12b of the S/H circuit 12 falls within a predetermined range.

Subsequently, as shown in FIG. 2A, the controller 15 causes the multiplexer 11 to select the first reference voltage Vref1 and turns on the switch 12a at a time point T4. At this time, the second detection voltage V2 selected at the time point T3 is 2 V, and the first reference voltage Vref1 is 5 V. For that reason, charges based on the voltage of the first reference voltage Vref1 are accumulated in the capacitor 12b, and the capacitor 12b obtains a voltage corresponding to the first reference voltage Vref1. Then, the controller 15 turns off the switch 12a at a time point T4a, causes the converter 13 to generate a digital signal based on the voltage of the capacitor 12b, and receives the digital signal. Thereafter, the controller 15 performs a predetermined process using the digital signal.

Next, the controller 15 causes the multiplexer 11 to select the first detection voltage V1, and turns on the switch 12a at a time point T5. In this case, the first detection voltage V1 selected at the time point T5 is 3 V, and the first reference voltage Vref1 is 5 V. For that reason, in the capacitor 12b, a part of the accumulated charges is discharged from the ground in the ground circuit in the first input unit 31 to obtain a voltage corresponding to the first detection voltage V1. Then, the controller 15 turns off the switch 12a at a time point T5a, causes the converter 13 to generate a digital signal based on the voltage of the capacitor 12b, and receives the digital signal. Thereafter, the controller 15 performs a predetermined process using the digital signal. More specifically, at that time, the controller 15 executes the first disconnection determination as one of the predetermined processes.

In other words, when the first signal line 41 is not disconnected, the capacitor 12b has a voltage corresponding to the first detection voltage V1, as shown in FIG. 2A. On the other hand, when the first signal line 41 is disconnected, the voltage of the capacitor 12b does not change even if the first detection voltage V1 is selected by the multiplexer 11 as shown in FIG. 2C. In other words, the digital signal generated at the time point T4a and the digital signal generated at the time point T5a are the same signal. For that reason, when the digital signal generated at the time point T4a and the digital signal generated at the time point T5a are the same signal, the controller 15 determines that a disconnection has occurred in the first signal line 41, and outputs a control signal for notifying an external circuit or the like of the occurrence of an abnormality.

It should be noted that FIG. 2C shows the voltage of the capacitor 12b when a disconnection has occurred in the first signal line 41 between the time point T2 and the time point T5.

In the present embodiment, as described above, the normal range of the first detection voltage V1 is 0 to 3 V, and the first reference voltage Vref1 is 5 V. For that reason, when the first signal line 41 is not disconnected, a digital signal having a value different from that of the digital signal corresponding to the first detection voltage V1 is generated before the digital signal corresponding to the first detection voltage V1 is generated. Therefore, the controller 15 can easily perform the first disconnection determination by determining whether or not the digital signal generated at the time point T4a coincides with the digital signal generated at the time point T5a. In the present embodiment, the first disconnection determination is performed by determining whether or not the digital signals coincide with each other, but the determination may be based on the presence or absence of a change in the voltage between the first reference voltage Vref1 and the first detection voltage V1 held by the capacitor 12b of the S/H circuit 12. The controller 15 executes the first disconnection determination as described above. For that reason, the first disconnection determination is to determine that the disconnection has occurred in the first signal line 41 when the change in the voltage between the first reference voltage Vref1 and the first detection voltage V1 held in the capacitor 12b of the S/H circuit 12 falls within a predetermined range.

Thereafter, the controller 15 performs the same processing as that after the time point T2, after a time point T6.

As described above, in the present embodiment, before the multiplexer 11 is caused to select the detection voltage input through the signal line to be determined by the disconnection determination, the multiplexer 11 is caused to select the reference voltage having a value different from the detection voltage. The disconnection determination is performed based on the presence or absence of a change in the voltage held by the capacitor 12b. For that reason, there is no need to provide a pull-down resistor on each signal line in order to perform disconnection determination, and an increase in the circuit scale can be inhibited.

In the present embodiment, the first reference voltage Vref1 has a value different from the normal range of the first detection voltage V1, and the second reference voltage Vref2 has a value different from the normal range of the second detection voltage V2. In addition, when performing the first disconnection determination, the controller 15 causes the multiplexer 11 to select the first reference voltage Vref1 before the selection of the first detection voltage V1. For that reason, the controller 15 determines whether or not the digital signal corresponding to the first detection voltage V1 and the digital signal corresponding to the first reference voltage Vref1 coincides with each other, thereby being capable of easily performing the first disconnection determination. Further, with the execution of the first disconnection determination in this manner, the normal range of the first detection voltage V1 can include 0, and the application range can be expanded.

In the same way, when performing the second disconnection determination, the controller 15 causes the multiplexer 11 to select the second reference voltage Vref2 before the selection of the second detection voltage V2. For that reason, the controller 15 determines whether or not the digital signal corresponding to the second detection voltage V2 and the digital signal corresponding to the second reference voltage Vref2 coincides with each other, thereby being capable of easily performing the second disconnection determination. With the execution of the second disconnection determination in this manner, the normal range of the second detection voltage V2 can include 5 V in addition to the above range.

In the present embodiment, as described above, a case in which the first and second detection voltages V1 and V2 are input to the AD conversion device 10 from the first and second input units 31 and 32. However, the present embodiment is also applicable to a case in which three or more detection voltages are input to the AD conversion device 10. When three or more detection voltages are input to the AD conversion device 10, the reference voltage may be added and adjusted as appropriate in accordance with the normal range of each detection voltage. Then, the controller 15 may cause the multiplexer 11 to select a reference voltage having a value different from the normal range of the detection voltage before the selection of each detection voltage, compare the digital signal of the detection voltage with the digital signal of the reference voltage to perform the disconnection determination.

Second Embodiment

A second embodiment will be described. The present embodiment is the same as the first embodiment except that a configuration of an AD conversion device 10 is changed from that of the first embodiment, and therefore a description of the same configuration will be omitted.

Figure 3:
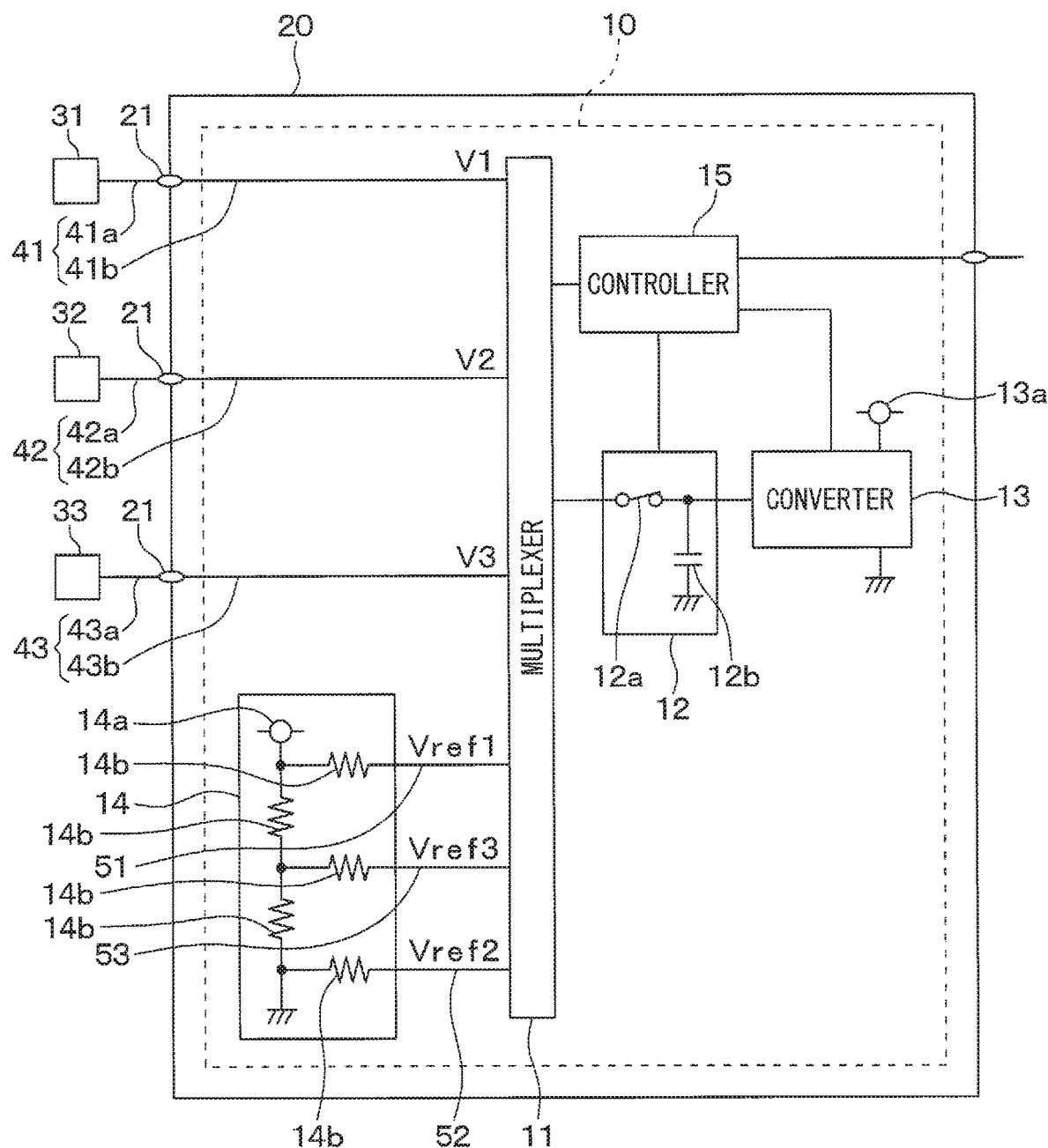
FIG. 3 is a diagram schematically showing an AD conversion device according to a second embodiment.

In the present embodiment, as shown in FIG. 3, a multiplexer 11 is connected to a third input unit 33 through a third signal line 43 together with a first input unit 31 and a second input unit 32. The third signal line 43 has the same configuration as that of the first and second signal lines 41 and 42. In other words, the third signal line 43 has a signal line 43a such as a wire disposed between a connection terminal 21 of an IC chip 20 and a terminal of the third input unit 33, and a signal line 43b such as a wiring pattern formed in the connection terminal 21 and the IC chip 20.

The multiplexer 11 receives a first detection voltage V1 and a second detection voltage V2 as well as a third detection voltage V3 from the third input unit 33. In the present embodiment, the third detection voltage V3 has a normal value of 0 V or 5 V. In other words, the third detection voltage V3 has a normal value equal to a first reference voltage Vref1 or a second reference voltage Vref2. In the present embodiment, the third detection voltage V3 corresponds to a third external voltage, 5 V corresponds to a first voltage, and 0 V corresponds to a second voltage.

The reference voltage input unit 14 is configured to input a third reference voltage Vref3 to the multiplexer 11 through a signal line 53 in addition to the first reference voltage Vref1 and the second reference voltage Vref2. In the present embodiment, the third reference voltage Vref3 is a voltage obtained by dividing the voltage of a power supply 14a and is about 2.5 V. In other words, the third reference voltage Vref3 is set to a value between available values of the third detection voltage V3.

The controller 15 is configured as in the first embodiment, and further, the present embodiment performs a third disconnection determination as to whether or not a disconnection has occurred in the third signal line 43 between the third input unit 33 and the multiplexer 11 (hereinafter simply referred to as a third disconnection determination).

Figure 4A:
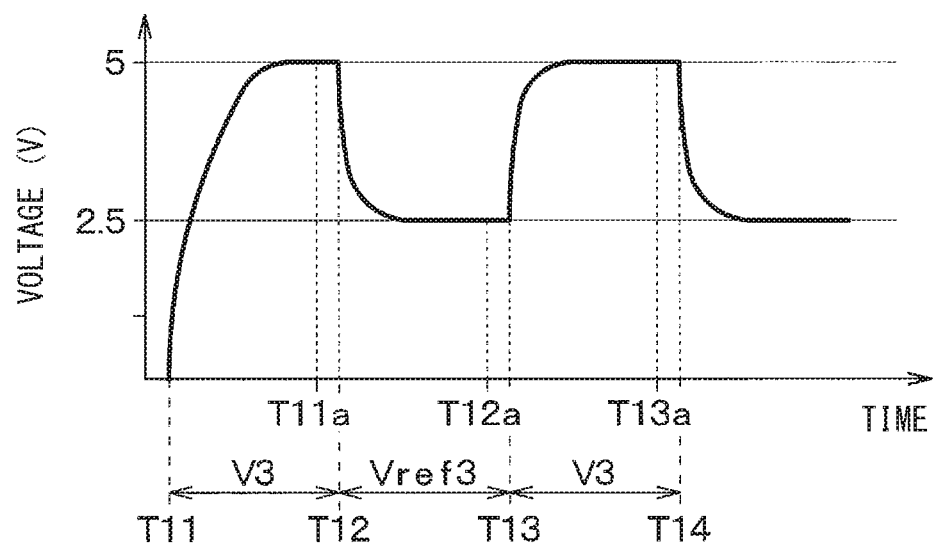
FIG. 4A is a timing chart showing a voltage of a capacitor in a normal state.
Figure 4B:
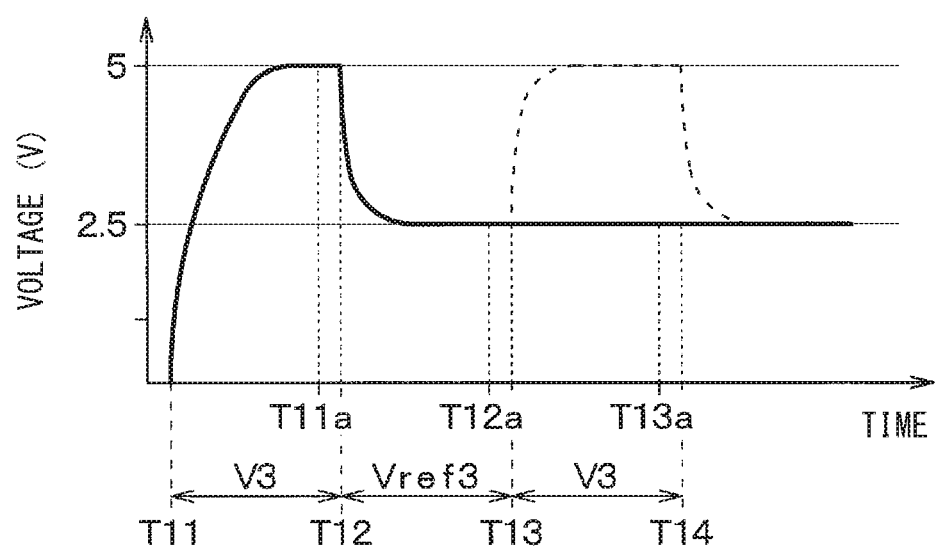
FIG. 4B is a timing chart showing the voltage of the capacitor when a disconnection occurs in a third signal line between a third input unit and a multiplexer.

The AD conversion device 10 according to the present embodiment is configured as described above. Next, operations performed by the controller 15 in the AD conversion device 10 will be described referring to FIG. 4A and FIG. 4B showing a voltage of a capacitor 12b. Incidentally, the operation of the controller 15 for the first detection voltage V1, the second detection voltage V2, the first reference voltage Vref1, and the second reference voltage Vref2 is the same as that in the first embodiment, and therefore, only a relationship between the third detection voltage V3 and the third reference voltage Vref3 will be described below. Hereinafter, an example in which the third detection voltage V3 is 5 V when the third detection voltage V3 is selected by the multiplexer 11. FIG. 4A and FIG. 4B show voltages selected by the multiplexer 11 between the respective time points.

At a time point T11, the controller 15 causes the multiplexer 11 to select the third detection voltage V3, and turns on the switch 12a. As a result, charges based on the third detection voltage V3 are accumulated in the capacitor 12b, and the capacitor 12b obtains a voltage corresponding to the third detection voltage V3. Then, the controller 15 turns off the switch 12a at a time point T11a, causes the converter 13 to generate a digital signal based on the voltage of the capacitor 12b, and receives the digital signal. Thereafter, the controller 15 performs a predetermined process using the digital signal.

Next, at a time point T12, the controller 15 causes the multiplexer 11 to select the third reference voltage Vref3 and turns on the switch 12a. At that time, since the third detection voltage V3 selected at the time point T11 is 5 V and the third reference voltage Vref3 is 2.5 V, the accumulated charges are discharged from the ground of the reference voltage input unit 14, and the capacitor 12b has a voltage corresponding to the third reference voltage Vref3. Then, the controller 15 turns off the switch 12a at a time point T12a, causes the converter 13 to generate a digital signal based on the voltage of the capacitor 12b, and receives the digital signal. Thereafter, the controller 15 performs a predetermined process using the digital signal.

Subsequently, at a time point T13, the controller 15 causes the multiplexer 11 to select the third detection voltage V3, and turns on the switch 12a. At that time, the third detection voltage V3 selected at the time point T13 is 5 V, and the third reference voltage Vref3 is 2.5 V. Therefore, when the third signal line 43 is not disconnected, the capacitor 12b accumulates the electric charge corresponding to the third detection voltage V3, and becomes the voltage corresponding to the third detection voltage V3. Then, the controller 15 turns off the switch 12a at a time point T13a, causes the converter 13 to generate a digital signal based on the voltage of the capacitor 12b, and receives the digital signal. Thereafter, the controller 15 performs a predetermined process using the digital signal. More specifically, at that time, the controller 15 executes the third disconnection determination as one of the predetermined processes.

In other words, when the third signal line 43 is not disconnected, the capacitor 12b has a voltage corresponding to the third detection voltage V3, as shown in FIG. 4A. On the other hand, when the third signal line 43 is disconnected, the voltage of the capacitor 12b does not change even if the third detection voltage V3 is selected by the multiplexer 11 as shown in FIG. 4B. In other words, the digital signal generated at the time point T12a and the digital signal generated at the time point T13a are the same signal. For that reason, when the digital signal generated at the time point T12a and the digital signal generated at the time point T13a are the same signal, the controller 15 determines that a disconnection has occurred in the third signal line 43, and outputs a control signal for notifying an external circuit or the like of the occurrence of an abnormality.

It should be noted that FIG. 4B shows the voltage of the capacitor 12b when a disconnection has occurred in the third signal line 43 between the time point T12 and the time point T13.

In the present embodiment, as described above, the normal value of the third detection voltage V3 is 0 V or 5 V, and the third reference voltage Vref3 is 2.5 V. For that reason, when the third signal line 43 is not disconnected, a digital signal having a value different from that of the digital signal corresponding to the third detection voltage V3 is generated before the digital signal corresponding to the third detection voltage V3 is generated. Therefore, the controller 15 can easily perform the third disconnection determination by determining whether or not the digital signal generated at the time point T12a coincides with the digital signal generated at the time point T13a. In the present embodiment, the third disconnection determination is performed by determining whether or not the digital signals coincide with each other, but the determination may be based on the presence or absence of a change in the voltage between the third reference voltage Vref3 and the third detection voltage V3 held by the capacitor 12b of the S/H circuit 12. Then, the controller 15 executes the third disconnection determination as described above. For that reason, the third disconnection determination is to determine that the disconnection has occurred in the third signal line 43 when the change in the voltage between the third reference voltage Vref3 and the third detection voltage V3 held in the capacitor 12b of the S/H circuit 12 falls within a predetermined range.

Thereafter, the controller 15 performs the same processing as that after the time point T12, after the time point T14. In the above description, the third detection voltage V3 to be selected is 5 V, but the same applies to a case in which the third detection voltage to be selected is 0 V.

As described above, in the present embodiment, the third detection voltage V3, which is one of the two voltages, is input through the third signal line 43, and the third reference voltage Vref3 differs from the third detection voltage V3. In addition, when performing the third disconnection determination, the controller 15 causes the multiplexer 11 to select the third reference voltage Vref3 before the selection of the third detection voltage V3. For that reason, the controller 15 determines whether or not the digital signal corresponding to the third detection voltage V3 and the digital signal corresponding to the third reference voltage Vref3 coincides with each other, thereby being capable of easily performing the third disconnection determination.

Further, in the present embodiment, the disconnection determination of the third signal line 43 to which the third detection voltage V3 which is one of the two voltages is input can be executed, thereby being capable of expanding the applicable range of the detection voltage.

The third reference voltage Vref3 differs from the third detection voltage V3 in value between the first reference voltage Vref1 and the second reference voltage Vref2. For that reason, a resistor 14b may be appropriately added to the reference voltage input unit 14 that generates the first reference voltage Vref1 and the second reference voltage Vref2, thereby being capable of inhibiting the complexity of the circuit.

Third Embodiment

A third embodiment will be described. In the present embodiment, since the abnormality determination or the like as to whether or not an abnormality has occurred in a reference voltage input unit 14 can also be performed in comparison with the first embodiment, and the other configurations are the same as those in the first embodiment, and therefore a description of the same configurations will be omitted.

An AD conversion device 10 according to the present embodiment has the same configuration as that of the first embodiment. However, a controller 15 of the present embodiment performs abnormality determination including whether or not an abnormality has occurred in the reference voltage input unit 14. In this example, the abnormality of the reference voltage input unit 14 includes a case in which in addition to a failure in the reference voltage input unit 14, a disconnection occurs in signal lines 51 and 52 connecting the reference voltage input unit 14 and a multiplexer 11. In other words, the occurrence of an abnormality in the reference voltage input unit 14 means that at least one of the occurrence of a failure in the reference voltage input unit 14 and the occurrence of a disconnection in the signal lines 51 and 52 occurs. Hereinafter, the occurrence of at least one of the failure in the reference voltage input unit 14 and the disconnection of the signal line 51 is referred to as a first abnormality, and the determination of whether or not the first abnormality has occurred is referred to as a first abnormality determination. The occurrence of at least one of the failure in the reference voltage input unit 14 and the disconnection of the signal line 52 is also referred to as a second abnormality, and the determination of whether or not the second abnormality has occurred is also referred to as a second abnormality determination.

Figure 5A:
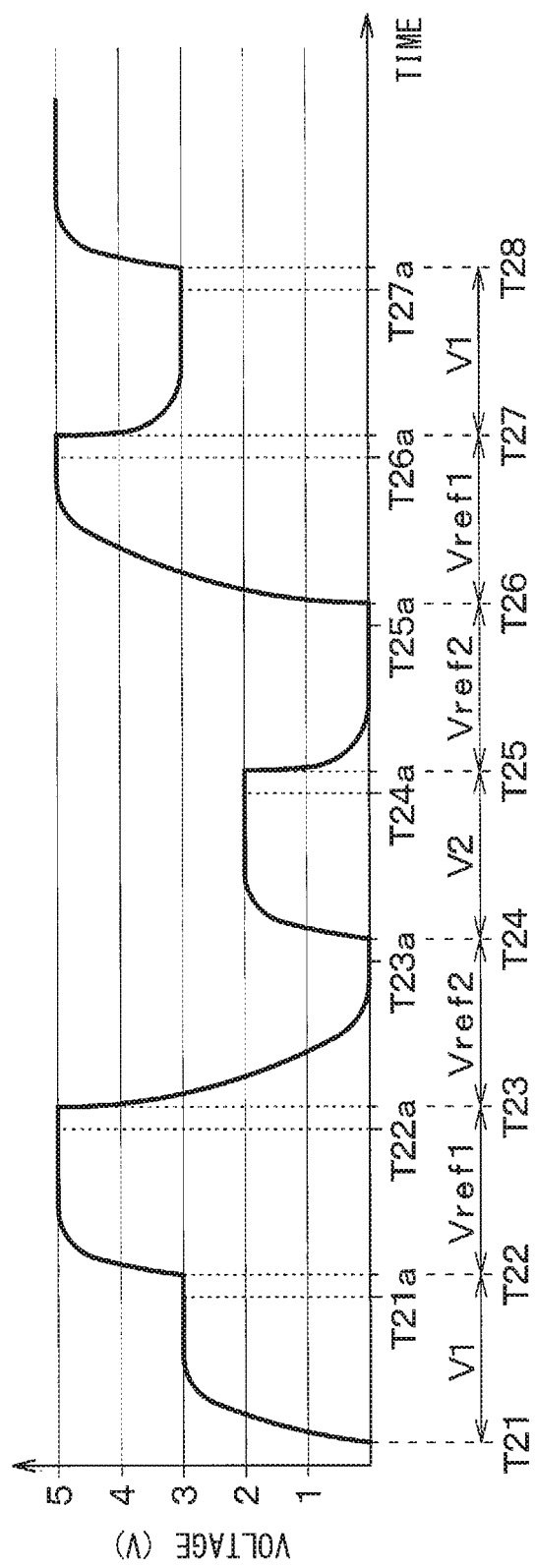
FIG. 5A is a timing chart showing a voltage of a capacitor in a normal state according to a third embodiment.
Figure 5B:
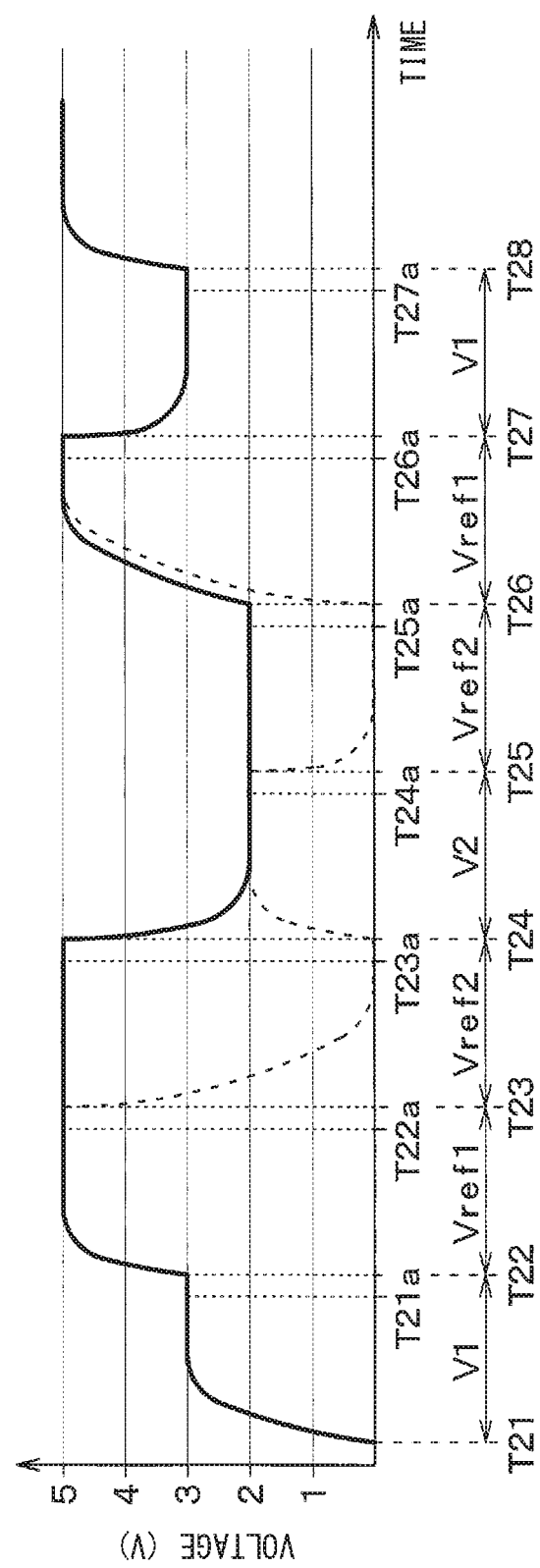
FIG. 5B is a timing chart showing a voltage of a capacitor when a second abnormality occurs according to the third embodiment.
Figure 5C:
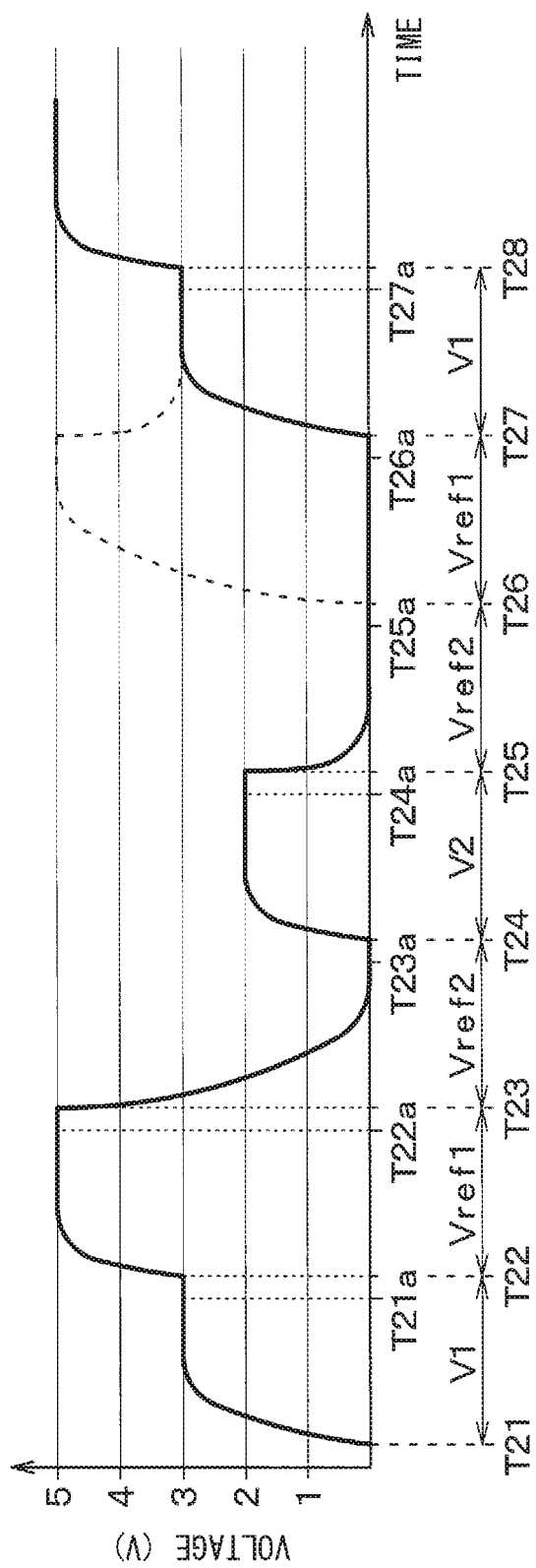
FIG. 5C is a timing chart showing a voltage of a capacitor when a first abnormality occurs according to the third embodiment.

Next, operations performed by the controller 15 in the AD conversion device 10 will be described referring to FIGS. 5A to 5C showing a voltage of the capacitor 12b. In the present embodiment, as in the above first embodiment, it is assumed that the normal range of the first detection voltage V1 is 0 to 3 V, the normal range of the second detection voltage V2 is 2 to 5 V, the first reference voltage Vref1 is 5 V, and the second reference voltage Vref2 is 0 V. Below, an example will be described below in which the first detection voltage V1 when the first detection voltage V1 is selected by the multiplexer 11 is 3 V, and the second detection voltage V2 when the second detection voltage V2 is selected is 2 V. FIGS. 5A to 5C show a voltage selected by the multiplexer 11 between the respective time points.

First, the controller 15 performs the same processing as that at the above-mentioned time point T1 at a time point T21, and performs the same processing as that at the above-mentioned time point T1a at a time point T21a.

Next, at a time point T22, the controller 15 causes the multiplexer 11 to select the first reference voltage Vref1 and turns on the switch 12a. At this time, the first detection voltage V1 selected at the time point T21 is 3 V, and the first reference voltage Vref1 is 5 V. For that reason, charges based on the voltage of the first reference voltage Vref1 are accumulated in the capacitor 12b, and the capacitor 12b obtains a voltage corresponding to the first reference voltage Vref1. Then, the controller 15 turns off the switch 12a at a time point T22a, causes the converter 13 to generate a digital signal based on the electric charges accumulated in the capacitor, and receives the digital signal. Thereafter, the controller 15 performs a predetermined process using the digital signal.

Subsequently, at a time point T23, the controller 15 causes the multiplexer 11 to select the second reference voltage Vref2 and turns on the switch 12a. At this time, the first reference voltage Vref1 selected at the time point T22 is 5 V, and the second reference voltage Vref2 is 0 V. For that reason, the accumulated charges are discharged from the ground of the reference voltage input unit 14, and the capacitor 12b has a voltage corresponding to the second reference voltage Vref2. Then, the controller 15 turns off the switch 12a at a time point T23a, causes the converter 13 to generate a digital signal based on the voltage of the capacitor 12b, and receives the digital signal. Thereafter, the controller 15 performs a predetermined process using the digital signal. More specifically, at this time, the controller 15 executes the second abnormality determination as one of predetermined processes.

In other words, when the second abnormality does not occur, the capacitor 12b has a voltage corresponding to the second reference voltage Vref2, as shown in FIG. 5A. On the other hand, when the second abnormality occurs, the voltage of the capacitor 12b does not change even if the second reference voltage Vref2 is selected by the multiplexer 11 as shown in FIG. 5B. In other words, the digital signal generated at the time point T22a and the digital signal generated at the time point T23a are the same signal. For that reason, when the digital signal generated at the time point T22a and the digital signal generated at the time point T23a are the same signal, the controller 15 determines that the second abnormality has occurred, and outputs a control signal for notifying the external circuit or the like that the second abnormality has occurred.

In the present embodiment, as described above, the normal range of the first detection voltage V1 is 0 to 3 V, and the second reference voltage Vref2 is 0 V. For that reason, when the second reference voltage Vref2 is converted into a digital signal immediately after the first detection voltage V1 and the digital signal corresponding to the first detection voltage V1 is compared with the digital signal corresponding to the second reference voltage Vref2, the second abnormality determination may not be performed. In other words, when 0 V is input as the first detection voltage V1, the first detection voltage V1 and the second reference voltage Vref2 become the same, and it cannot be determined whether or not the second abnormality has occurred. Therefore, in the present embodiment, the first reference voltage Vref1 is converted into a digital signal before the digital conversion of the second reference voltage Vref2. When the second abnormality does not occur, a digital signal different from the digital signal of the second reference voltage Vref2 is generated before the second reference voltage Vref2 is converted into the digital signal. As a result, the controller 15 can easily perform the second abnormality determination by determining whether or not the digital signal generated at the time point T22a coincides with the digital signal generated at the time point T23a. In the present embodiment, the second abnormality determination is performed by determining whether or not the digital signals coincide with each other, but the determination may be based on the presence or absence of a change in the voltage between the first reference voltage Vref1 and the second reference voltage Vref2 held in the capacitor 12b of the S/H circuit 12. Then, the controller 15 executes the second abnormality determination as described above. For that reason, the second abnormality determination is to determine that the second abnormality has occurred when the change in the voltage between the first reference voltage Vref1 and the second reference voltage Vref2 held by the capacitor 12b of the S/H circuit 12 falls within a predetermined range.

Subsequently, as shown in FIG. 5A, the controller 15 performs the same processing as that at the time point T3, at a time point T24, and performs the same processing as that at the time point T3a, at a time point T24a.

Next, at a time point T25, the controller 15 causes the multiplexer 11 to select the second reference voltage Vref2 and turns on the switch 12a. At that time, the second detection voltage V2 selected at the time point T24 is 2 V, and the second reference voltage Vref2 is 0 V. For that reason, the accumulated charges are discharged from the ground of the reference voltage input unit 14, and the capacitor 12b has a voltage corresponding to the second reference voltage Vref2. Then, the controller 15 turns off the switch 12a at a time point T25a, causes the converter 13 to generate a digital signal based on the voltage of the capacitor 12b, and receives the digital signal. Thereafter, the controller 15 performs a predetermined process using the digital signal.

Subsequently, at a time point T26, the controller 15 causes the multiplexer 11 to select the first reference voltage Vref1 and turns on the switch 12a. As a result, charges based on the first reference voltage Vref1 are accumulated in the capacitor 12b, and the capacitor 12b obtains a voltage corresponding to the first reference voltage Vref1. Then, the controller 15 turns off the switch 12a at a time point T26a, causes the converter 13 to generate a digital signal based on the voltage of the capacitor 12b, and receives the digital signal. Thereafter, the controller 15 performs a predetermined process using the digital signal. More specifically, at this point in time, the controller 15 executes the first abnormality determination as one of predetermined processes.

In other words, when the first abnormality does not occur, the capacitor 12b has a voltage corresponding to the first reference voltage Vref1, as shown in FIG. 5A. On the other hand, when the first abnormality occurs, the voltage of the capacitor 12b does not change even if the first reference voltage Vref1 is selected by the multiplexer 11 as shown in FIG. 5C. In other words, the digital signal generated at the time point T25a and the digital signal generated at the time point T26a are the same signal. For that reason, when the digital signal generated at the time point T25a and the digital signal generated at the time point T26a are the same signal, the controller 15 determines that the first abnormality has occurred, and outputs a control signal for notifying the external circuit or the like of the occurrence of the abnormality.

Incidentally, FIG. 5C shows the voltage of the capacitor 12b when the first abnormality has occurred between the time point T23 and the time point T26.

In the present embodiment, as described above, the normal range of the second detection voltage V2 is 2 to 5 V, and the first reference voltage Vref1 is 5 V. For that reason, when the first reference voltage Vref1 is converted into a digital signal immediately after the second detection voltage V2 and the digital signal corresponding to the second detection voltage V2 is compared with the digital signal corresponding to the first reference voltage Vref1, the first abnormality determination may not be performed. In other words, when 5 V is input as the second detection voltage V2, the second detection voltage V2 and the first reference voltage Vref1 become the same, and it cannot be determined whether or not the first abnormality has occurred. Therefore, in the present embodiment, the second reference voltage Vref2 is converted into a digital signal before the digital conversion of the first reference voltage Vref1. When the first abnormality does not occur, a digital signal different from the digital signal of the first reference voltage Vref1 is generated before the first reference voltage Vref1 is converted into the digital signal. As a result, the controller 15 can easily perform the first abnormality determination by determining whether or not the digital signal generated at the time point T25a coincides with the digital signal generated at the time point T26a. In the present embodiment, the first disconnection determination is performed by determining whether or not the digital signals coincide with each other, but the determination may be based on the presence or absence of a change in the voltage between the second reference voltage Vref2 and the first reference voltage Vref1 held in the capacitor 12b of the S/H circuit 12. Then, the controller 15 executes the first abnormality determination as described above. For that reason, the first abnormality determination is to determine that the first abnormality has occurred when the change in the voltage between the second reference voltage Vref2 and the first reference voltage Vref1 held by the capacitor 12b of the S/H circuit 12 falls within a predetermined range.

Subsequently, as shown in FIG. 5A, the controller 15 performs the same processing as that at the time point T5, at a time point T27, and performs the same processing as that at the time point T5a, at a time point T27a. Thereafter, the controller 15 performs the same processing as that after the time point T22, after the time point T28.

As described above, in the present embodiment, since the first and second abnormality determinations are also executed, the abnormality of the AD conversion device 10 can be determined with higher accuracy.

When executing the first abnormality determination, the controller 15 causes the multiplexer 11 to select the second reference voltage Vref2 before the selection of the first reference voltage Vref1. When executing the second abnormality determination, the controller 15 causes the multiplexer 11 to select the first reference voltage Vref1 before the selection of the second reference voltage Vref2. For that reason, the controller 15 can easily perform the first abnormality determination and the second abnormality determination by determining whether or not the digital signal corresponding to the first reference voltage Vref1 coincides with the digital signal corresponding to the second reference voltage Vref2.

Further, in the present embodiment, the controller 15 performs the first abnormality determination and the second abnormality determination by changing the order of the voltages selected by the multiplexer 11. In other words, in the present embodiment, there is no need to add a new circuit in order to perform the first abnormality determination and the second abnormality determination. Therefore, in the present embodiment, the first abnormality determination and the second abnormality determination can be performed while an increase in the circuit scale is inhibited.

Fourth Embodiment

A fourth embodiment will be described. In the present embodiment, normal ranges of a first detection voltage V1 and a second detection voltage V2 are changed with respect to the first embodiment, and a first abnormality determination and a second abnormality determination are performed as in the third embodiment. The other configurations are the same as those of the first embodiment, and therefore a description of the same configurations will be omitted below.

An AD conversion device 10 according to the present embodiment has the same configuration as that of the first embodiment. However, in the present embodiment, the normal range of the first detection voltage V1 is set to 1 to 3 V, and the normal range of the second detection voltage V2 is set to 2 to 4 V. In other words, a first reference voltage Vref1 and a second reference voltage Vref2 have values different from the first detection voltage V1 and the second detection voltage V2, respectively.

Figure 6A:
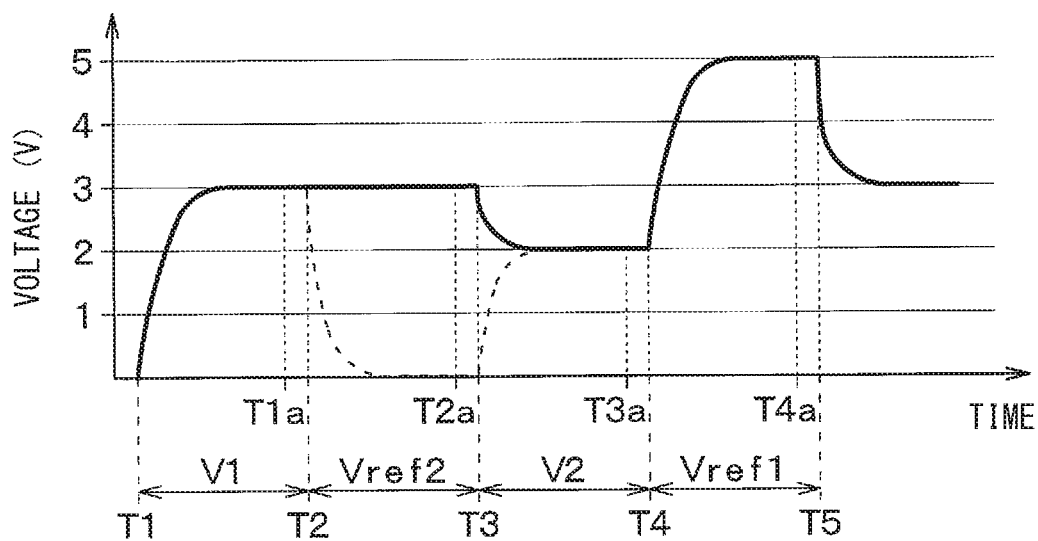
FIG. 6A is a timing chart showing a voltage of a capacitor when a second abnormality occurs according to a fourth embodiment.
Figure 6B:
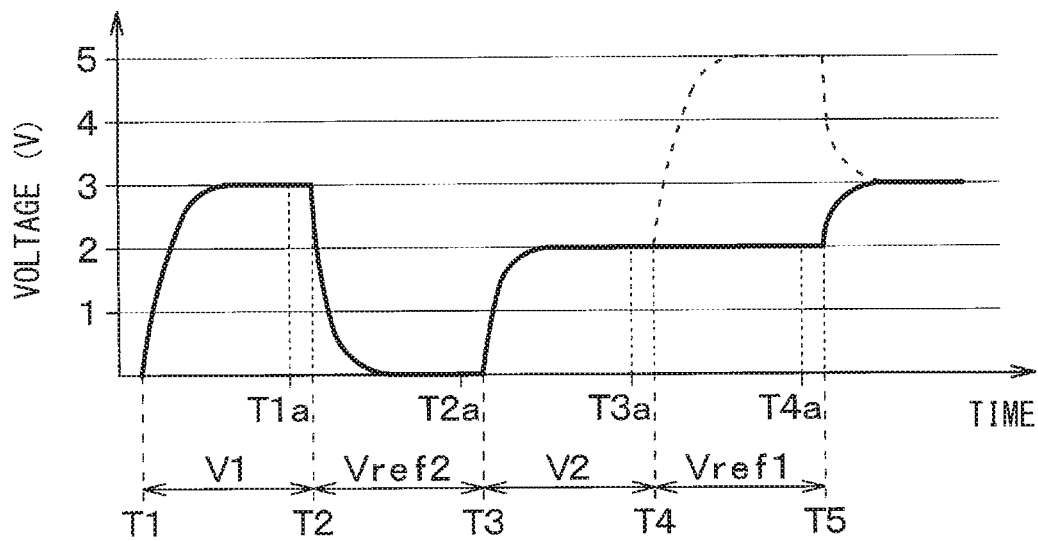
FIG. 6B is a timing chart showing a voltage of the capacitor when a first abnormality occurs according to the fourth embodiment.

Next, the operation performed by a controller 15 in the AD conversion device 10 will be described with reference to FIG. 2A, FIG. 6A, and FIG. 6B showing a voltage of a capacitor 12b. In the present embodiment, as described above, the normal range of the first detection voltage V1 is 1 to 3 V, the normal range of the second detection voltage V2 is 2 to 4 V, the first reference voltage Vref1 is 5 V, and the second reference voltage Vref2 is 0 V. In the following description, an example will be described below in which the first detection voltage V1 when the first detection voltage V1 is selected by the multiplexer 11 is 3 V, and the second detection voltage V2 when the second detection voltage V2 is selected is 2 V. FIG. 6A and FIG. 6B show voltages selected by the multiplexer 11 between the respective time points.

The operation of the controller 15 according to the present embodiment is basically the same as that described in the first embodiment. At a time point T2a, the controller 15 executes the second abnormality determination as one of the predetermined processes.

In other words, when the second abnormality does not occur, the capacitor 12b changes to a voltage corresponding to the second reference voltage Vref2 from a time point T2 as shown in FIG. 2A. On the other hand, when the second abnormality occurs, the voltage of the capacitor 12b does not change even if the second reference voltage Vref2 is selected by the multiplexer 11 as shown in FIG. 6A. In other words, a digital signal generated at a time point T1a and a digital signal generated at a time point T2a are the same signal. For that reason, when the digital signal generated at the time point T1a and the digital signal generated at the time point T2a are the same signal, the controller 15 determines that the second abnormality has occurred, and outputs a control signal for notifying the external circuit or the like of the occurrence of the abnormality.

In the present embodiment, as described above, the normal range of the first detection voltage V1 is 1 to 3 V, and the second reference voltage Vref2 is 0 V. Therefore, when the second abnormality does not occur, a digital signal having a value different from that of the digital signal of the second reference voltage Vref2 is generated prior to the generation of the digital signal corresponding to the second reference voltage Vref2. Therefore, the controller 15 can easily perform the second abnormality determination by determining whether or not the digital signal generated at the time point T1a coincides with the digital signal generated at the time point T2a. Then, the controller 15 executes the second abnormality determination as described above. For that reason, the second abnormality determination is to determine that the second abnormality has occurred when a change in the voltage between the first detection voltage V1 and the second reference voltage Vref2 held by the capacitor 12b of the S/H circuit 12 falls within a predetermined range.

At a time point T4a, the controller 15 executes the first abnormality determination as one of predetermined processes.

In other words, when the first abnormality does not occur, the capacitor 12b changes to a voltage corresponding to the first reference voltage Vref1 from a time point T4, as shown in FIG. 2A. On the other hand, when the first abnormality occurs, the voltage of the capacitor 12b does not change even if the first reference voltage Vref1 is selected by the multiplexer 11 as shown in FIG. 6B. In other words, a digital signal generated at a time point T3a and a digital signal generated at a time point T4a are the same signal. For that reason, when the digital signal generated at the time point T3a and the digital signal generated at the time point T4a are the same signal, the controller 15 determines that the first abnormality has occurred, and outputs a control signal for notifying the external circuit or the like of the occurrence of the abnormality.

In the present embodiment, as described above, the normal range of the second detection voltage V2 is 2 to 4 V, and the first reference voltage Vref1 is 5 V. For that reason, when the first abnormality does not occur, a digital signal having a value different from that of the digital signal corresponding to the first reference voltage Vref1 is generated before the digital signal corresponding to the first reference voltage Vref1 is generated. Therefore, the controller 15 can easily perform the first abnormality determination by determining whether or not the digital signal generated at the time point T3a coincides with the digital signal generated at the time point T4a. Then, the controller 15 executes the first abnormality determination as described above. For that reason, the first abnormality determination is to determine that the first abnormality has occurred when a change in the voltage between the second detection voltage V2 and the first reference voltage Vref1 held by the capacitor 12b of the S/H circuit 12 falls within a predetermined range.

As described above, in the present embodiment, the first reference voltage Vref1 and the second reference voltage Vref2 have values different from the first detection voltage V1 and the second detection voltage V2, respectively. For that reason, even if the second detection voltage V2 is selected by the multiplexer 11 prior to the selection of the first reference voltage Vref1, the digital signal corresponding to the first reference voltage Vref1 and the digital signal corresponding to the second detection voltage V2 have different values. In other words, the second detection voltage V2 used in the second disconnection determination can be used as it is. In the same manner, even if the first detection voltage V1 is selected by the multiplexer 11 prior to the selection of the second reference voltage Vref2, the digital signal corresponding to the second reference voltage Vref2 and the digital signal corresponding to the first detection voltage V1 have different values. In other words, the first detection voltage V1 used in the first disconnection determination can be used as it is.

For that reason, as compared with the third embodiment, the second reference voltage Vref2 does not need to be selected by the multiplexer 11 in order to perform the first abnormality determination, and the first reference voltage Vref1 does not need to be selected by the multiplexer 11 in order to perform the second abnormality determination. Therefore, according to the present embodiment, a total period required to make all the determinations of the first disconnection determination, the second disconnection determination, the first abnormality determination, and the second abnormality determination can be shortened.

In the present embodiment, the first reference voltage Vref1 and the second reference voltage Vref2 are different from the first detection voltage V1 and the second detection voltage V2. For that reason, even if the first reference voltage Vref1 is converted prior to the conversion of the second detection voltage V2, the second detection voltage V2 and the first reference voltage Vref1 differ from each other. Therefore, the first reference voltage Vref1 may be converted prior to the conversion of the second detection voltage V2. In the same manner, the second reference voltage Vref2 may be converted prior to the conversion of the first detection voltage V1.

Other Embodiments

Although the present disclosure has been described in accordance with embodiments, it is understood that the present disclosure is not limited to such embodiments or structures. The present disclosure encompasses various modifications and variations within the scope of equivalents. In addition, various combinations and configurations, as well as other combinations and configurations that include only one element, more, or less, are within the scope and spirit of the present disclosure.

Figure 7:
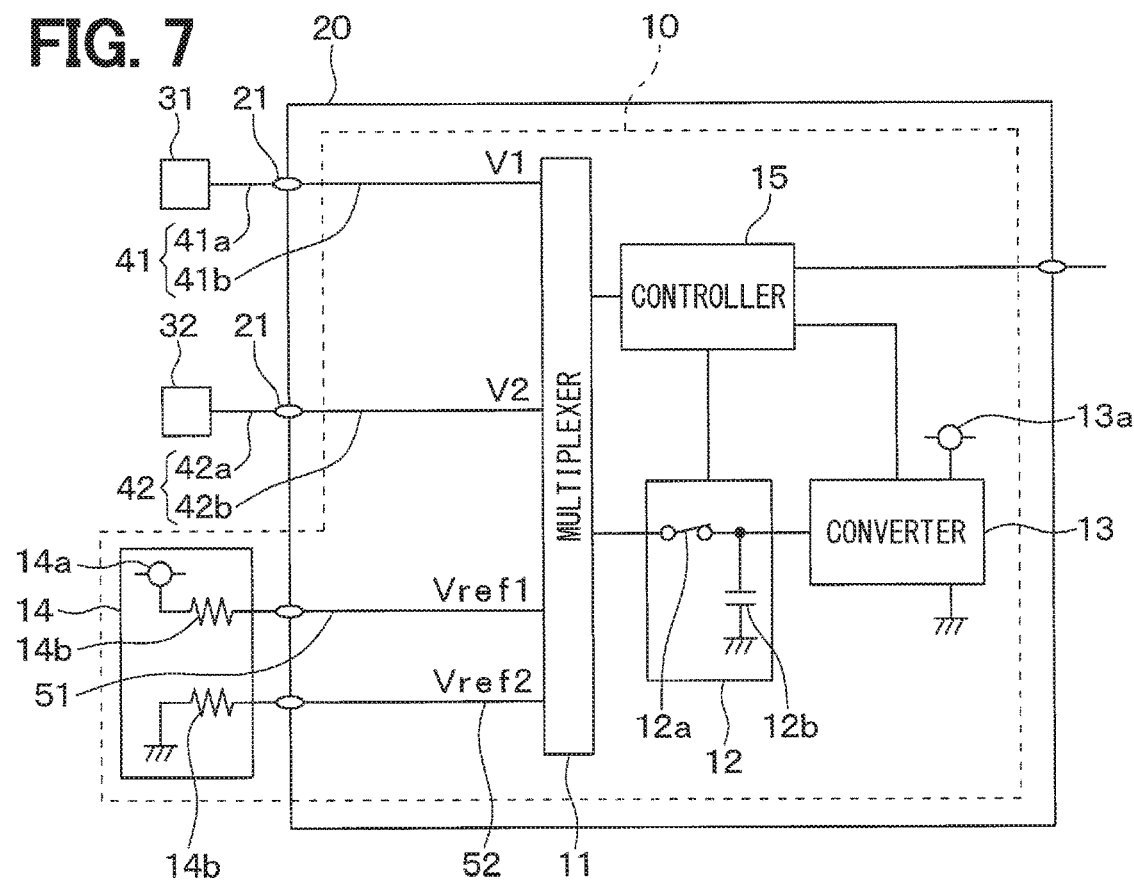
FIG. 7 is a diagram schematically showing an AD conversion device according to another embodiment.

For example, in each of the above embodiments, the multiplexer 11, the S/H circuit 12, the converter 13, the reference voltage input unit 14, and the controller 15 may not be mounted on the common IC chip 20. For example, in the first, third, and fourth embodiments, as shown in FIG. 7, the reference voltage input unit 14 may not be mounted on the IC chip 20, but may be mounted on another chip. Similarly, in the second embodiment, although not particularly illustrated, the reference voltage input unit 14 may not be mounted on the IC chip 20. In each of the above embodiments, although not particularly illustrated, for example, when the IC chip 20 is mounted on a vehicle in use, the controller 15 may not be mounted on the IC chip 20, and a vehicle ECU (that is, an Engine Control Unit) may exert the function of the controller 15 of each of the above embodiments.

Further, in each of the above-mentioned embodiments, a plurality of controllers 15 may be provided, and each controller 15 may exhibit the above-mentioned function. For example, a controller for controlling the multiplexer 11, a controller for controlling the S/H circuit 12, and a controller for controlling the converter 13 may be separately provided.

Figure 8:
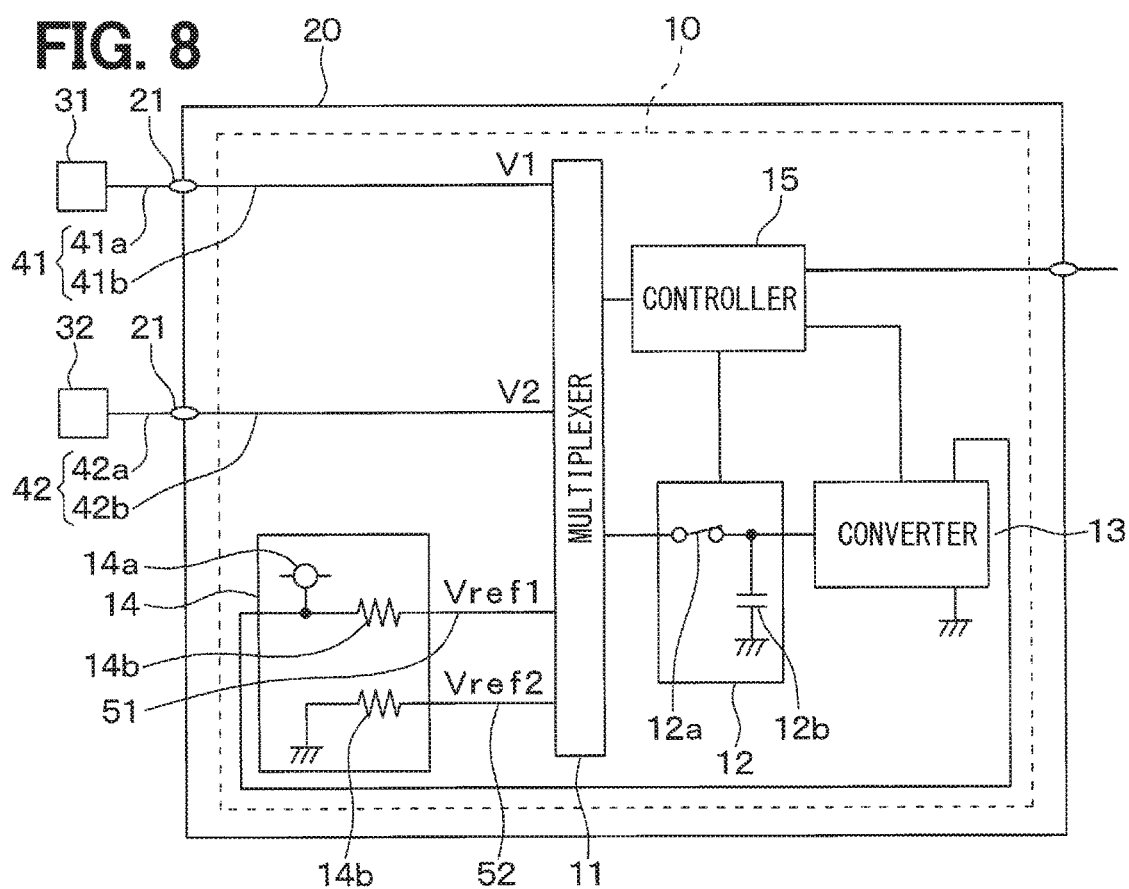
FIG. 8 is a diagram schematically showing an AD conversion device according to another embodiment.

Further, in each of the above embodiments, the conversion reference voltage is input from the reference power source 13a to the converter 13, but as shown in FIG. 8, the conversion reference voltage may be input from the reference voltage input unit 14 without provision of the reference power supply 13a. According to this configuration, the number of components can be reduced, and the circuit scale can be further reduced.

In addition, in each of the above embodiment, with the use of the reference voltage input from the reference voltage input unit 14, the controller 15 may perform the abnormality determination of the converter 13 based on the digital signal when the converter 13 generates the digital signal corresponding to the reference voltage. In other words, the reference voltage input from the reference voltage input unit 14 may be used for another purpose. In other words, the reference voltage generation unit for generating the reference voltage for performing the abnormality determination of the converter 13 may have a function as the reference voltage input unit 14 of each of the above embodiments. According to the above configuration, the function can be improved while an increase in the number of parts is inhibited.

In each of the above-described embodiments, the controller 15 may directly read the voltage of the capacitor 12b, and execute each determination based on the presence or absence of a change in the voltage of the capacitor 12b. Even when the determination is performed in this manner, it is preferable to determine that a disconnection or an abnormality has occurred when a change in the voltage of the capacitor 12b falls within a predetermined range in consideration of a detection error or the like.

Figure 9:
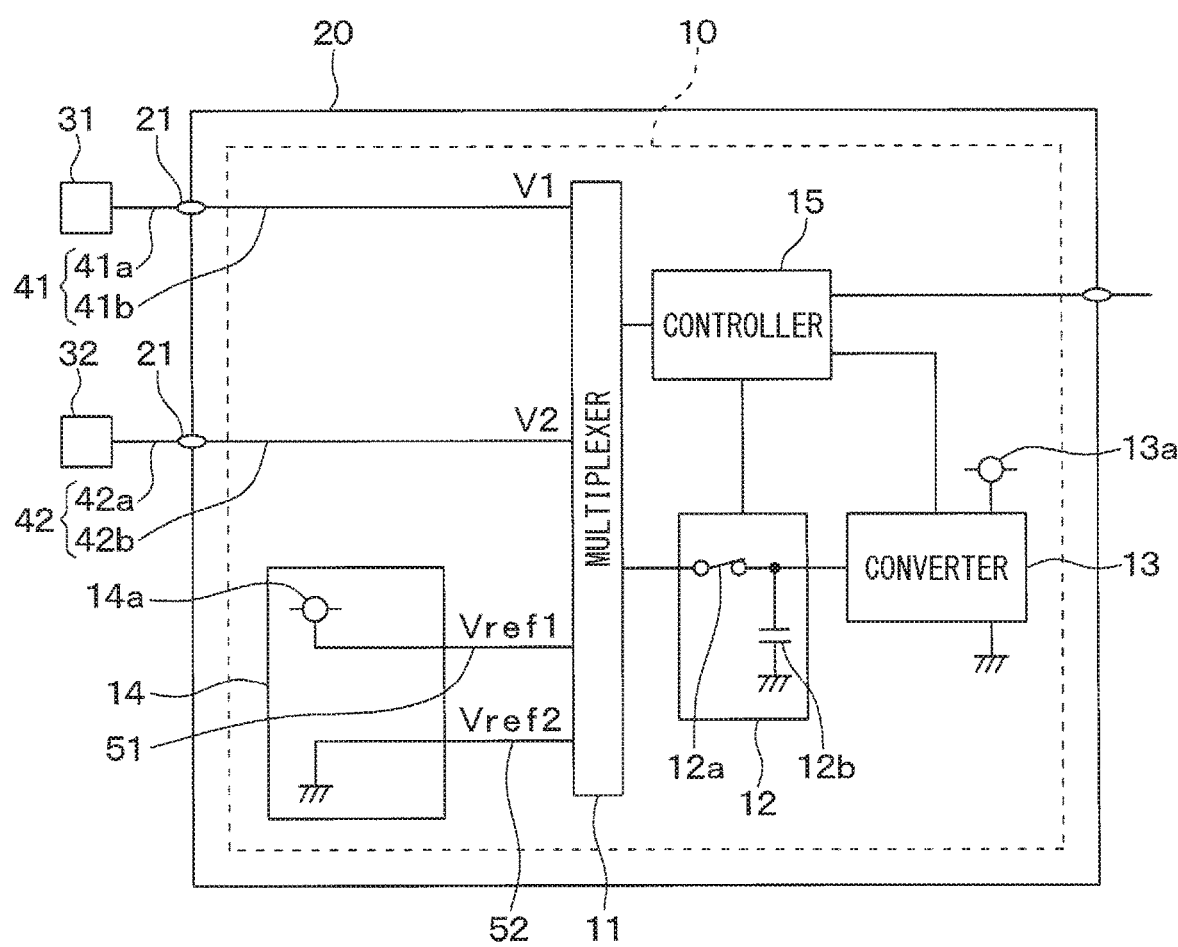
FIG. 9 is a diagram schematically showing an AD conversion device according to another embodiment.

In the first, third, and fourth embodiments, as shown in FIG. 9, the resistor 14b may not be disposed between the power supply 14a and the multiplexer 11. Similarly, as shown in FIG. 9, the resistor 14b may not be disposed between the ground of the reference voltage input unit 14 and the multiplexer 11. Although not particularly illustrated, the same applies to the second embodiment.

Further, the above embodiments may be combined together as appropriate. For example, the second embodiment may be combined with the third and fourth embodiments, and the third detection voltage V3 may be input from the third input unit 33.

In each of the above embodiments, the storage medium or the memory is a non-transitory tangible storage medium.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An analog-digital conversion device that converts an analog signal input from each of a plurality of input units into a digital signal, the analog-digital conversion device comprising:
    a switch that is respectively connected to the plurality of input units through a plurality of signal lines, receives a plurality of external voltages as a plurality of analog signals from the plurality of input units, and selects and outputs one of the plurality of external voltages;
    a sample and hold circuit that holds a voltage corresponding to the one of the plurality of external voltages output from the switch;
    a converter that performs an analog-to-digital conversion based on the voltage held by the sample and hold circuit;
    a controller that determines the one of the plurality of external voltages to be selected by the switch, and performs a disconnection determination whether a disconnection occurs in one of the signal lines; and
    a reference voltage input unit that is connected to the switch, and inputs a predetermined reference voltage to the switch, wherein:
    the sample and hold circuit comprises a sample and hold circuit switch and a capacitor that is connected to ground, the sample and hold circuit switch connected between the switch and the converter, and the capacitor connected between a connection point of the sample and hold circuit switch, the converter and the ground, the capacitor configured to hold the voltage corresponding to the one of the plurality of external voltage output from the switch when the sample and hold circuit switch is turned on;
    in the disconnection determination, the controller controls the switch to select the predetermined reference voltage which is different from the one of the plurality of external voltages before the controller controls the switch to select the one of the plurality of external voltages which is input through the one of the signal lines to be determined in the disconnection determination;
    after the controller controls the switch to select the one of the plurality of external voltages, the controller determines, based on a voltage difference between the predetermined reference voltage and the external voltage held in the sample and hold circuit, that the disconnection occurs in the one of the signal lines when the voltage difference is disposed in a predetermined range;
    the switch receives a first external voltage in a first predetermined range from a first input unit which is one of the plurality of input units, receives a second external voltage in a second predetermined range from a second input unit which is another one of the plurality of input units, and receives, from the reference voltage input unit, a first reference voltage different from the first predetermined range and a second reference voltage different from the second predetermined range and different from the first reference voltage;

in the disconnection determination, the controller performs a first disconnection determination in which the controller controls the switch to select the first reference voltage before controlling the switch to select the first external voltage, and after controlling the switch to select the first external voltage, based on the voltage difference between the first reference voltage and the first external voltage held in the sample and hold circuit, the controller determines that the disconnection occurs in the one of the signal lines between the first input unit and the switch when the voltage difference is disposed in the predetermined range; and in the disconnection determination, the controller performs a second disconnection determination in which the controller controls the switch to select the second reference voltage before controlling the switch to select the second external voltage, and after controlling the switch to select the second external voltage, based on another voltage difference between the second reference voltage and the second external voltage held in the sample and hold circuit, the controller determines that the disconnection occurs in another one of the signal lines between the second input unit and the switch when the another voltage difference is disposed in another predetermined range.

2. The analog-digital conversion device according to claim 1, wherein:

the switch receives a third external voltage, which is equal to a first voltage or a second voltage, from a third input unit which is further another one of the plurality of input units, and receives a third reference voltage between the first voltage and the second voltage from the reference voltage input unit; and in the disconnection determination, the controller performs a third disconnection determination in which the controller controls the switch to select the third reference voltage before controlling the switch to select the third external voltage, and after controlling the switch to select the third external voltage, based on further another voltage difference between the third reference voltage and the third external voltage held in the sample and hold circuit, the controller determines that the disconnection occurs in further another one of the signal lines between the third input unit and the switch when the further another voltage difference is disposed in further another predetermined range.

3. The analog-digital conversion device according to claim 1, wherein:

the first reference voltage is disposed in the second predetermined range;

the second reference voltage is disposed in the first predetermined range; and the controller controls the switch to successively select the first reference voltage and the second reference voltage, and, based on a reference voltage difference between the first reference voltage and the second reference voltage held in the sample and hold circuit, performs an abnormality determination to determine that an abnormality occurs in the reference voltage input unit when the reference voltage difference is disposed in a certain range.

4. The analog-digital conversion device according to claim 1, wherein:

the first reference voltage is disposed outside the first predetermined range;

the second reference voltage is disposed outside the second predetermined range; and the controller performs an abnormality determination in which the controller controls the switch to select the first external voltage or the second external voltage before controlling the switch to select the first reference voltage or the second reference voltage, and after controlling the switch to select the first reference voltage or the second reference voltage, based on a voltage difference value between the first external voltage or the second external voltage and the first reference voltage or the second reference voltage held in the sample and hold circuit, the controller determines that an abnormality occurs in the reference voltage input unit when the voltage difference value is disposed in a certain predetermined range.

5. The analog-digital conversion device according to claim 1, wherein:

the converter quantizes a voltage in a range between a conversion reference voltage and a predetermined voltage; and the reference voltage input unit is connected to the converter, and applies the conversion reference voltage to the converter.

6. An analog-digital conversion device that converts an analog signal input from each of a plurality of input units into a digital signal, the analog-digital conversion device comprising:

a switch that is respectively connected to the plurality of input units through a plurality of signal lines, receives a plurality of external voltages as a plurality of analog signals from the plurality of input units, and selects and outputs one of the plurality of external voltages;

a sample and hold circuit that holds a voltage corresponding to the one of the plurality of external voltages output from the switch;

a converter that performs an analog-to-digital conversion based on the voltage held by the sample and hold circuit;

a controller that determines the one of the plurality of external voltages to be selected by the switch, and performs a disconnection determination whether a disconnection occurs in one of the signal lines; and a reference voltage input unit that is connected to the switch, and inputs a predetermined reference voltage to the switch, wherein:

the sample and hold circuit comprises a sample and hold circuit switch and a capacitor that is connected to ground, the sample and hold circuit switch connected between the switch and the converter, and the capacitor connected between a connection point of the sample and hold circuit switch, the converter and the ground, the capacitor configured to hold the voltage corresponding to the one of the plurality of external voltages output from the switch when the sample and hold circuit switch is turned on;

in the disconnection determination, the controller controls the switch to select the predetermined reference voltage which is different from the one of the plurality of external voltages before the controller controls the switch to select the one of the plurality of external voltages which is input through the one of the signal lines to be determined in the disconnection determination;

after the controller controls the switch to select the one of the plurality of external voltages, the controller determines, based on a voltage difference between the predetermined reference voltage and the external voltage held in the sample and hold circuit, that the disconnection occurs in the one of the signal lines when the voltage difference is disposed in a predetermined range;

the converter quantizes a voltage in a range between a conversion reference voltage and a predetermined voltage; and the reference voltage input unit is connected to the converter, and applies the conversion reference voltage to the converter.

7. The analog-digital conversion device according to claim 1, wherein:

when the controller controls the converter to perform the analog-to-digital conversion on the predetermined reference voltage generated in the reference voltage input unit, the controller performs an abnormality determination of the converter based on a converted digital signal.

8. An analog-digital conversion device that converts an analog signal input from each of a plurality of input units into a digital signal, the analog-digital conversion device comprising:

a switch that is respectively connected to the plurality of input units through a plurality of signal lines, receives a plurality of external voltages as a plurality of analog signals from the plurality of input units, and selects and outputs one of the plurality of external voltages;

a sample and hold circuit that holds a voltage corresponding to the one of the plurality of external voltages output from the switch;

a converter that performs an analog-to-digital conversion based on the voltage held by the sample and hold circuit;

a controller that determines the one of the plurality of external voltages to be selected by the switch, and performs a disconnection determination whether a disconnection occurs in one of the signal lines; and a reference voltage input unit that is connected to the switch, and inputs a predetermined reference voltage to the switch, wherein:

the sample and hold circuit comprises a sample and hold circuit switch and a capacitor that is connected to ground, the sample and hold circuit switch connected between the switch and the converter, and the capacitor connected between a connection point of the sample and hold circuit switch, the converter and the ground, the capacitor configured to hold the voltage corresponding to the one of the plurality of external voltages output from the switch when the sample and hold circuit switch is turned on;

in the disconnection determination, the controller controls the switch to select the predetermined reference voltage which is different from the one of the plurality of external voltages before the controller controls the switch to select the one of the plurality of external voltages which is input through the one of the signal lines to be determined in the disconnection determination;

after the controller controls the switch to select the one of the plurality of external voltages, the controller determines, based on a voltage difference between the predetermined reference voltage and the external voltage held in the sample and hold circuit, that the disconnection occurs in the one of the signal lines when the voltage difference is disposed in a predetermined range; and when the controller controls the converter to perform the analog-to-digital conversion on the predetermined reference voltage generated in the reference voltage input unit, the controller performs an abnormality determination of the converter based on a converted digital signal.

* * * * *